(12) United States Patent
Beatson et al.

(10) Patent No.: US 6,608,390 B2
(45) Date of Patent: Aug. 19, 2003

(54) WIREBONDED SEMICONDUCTOR PACKAGE STRUCTURE AND METHOD OF MANUFACTURE

(75) Inventors: David T. Beatson, Kennett Square, PA (US); Andrew F. Hmiel, Glenside, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 10/054,231

(22) Filed: Nov. 13, 2001

(65) Prior Publication Data

US 2003/0090001 A1 May 15, 2003

(51) Int. Cl.$^7$ .......................... H01L 23/48; H01L 23/52
(52) U.S. Cl. ........................................ 257/784; 257/786
(58) Field of Search ................................ 257/784, 786, 257/666, 735

(56) References Cited

U.S. PATENT DOCUMENTS

| | | |
|---|---|---|
| 4,680,613 A | 7/1987 | Daniels et al. |
| 4,686,492 A | 8/1987 | Grellman et al. |
| 4,751,482 A | 6/1988 | Fukuta et al. |
| 4,835,120 A | 5/1989 | Mallik et al. |
| 4,967,315 A | 10/1990 | Schelhorn |
| 5,006,820 A | 4/1991 | Prioste et al. |
| 5,140,407 A | 8/1992 | Kamada |
| 5,166,772 A | 11/1992 | Soldner et al. |
| 5,172,471 A | 12/1992 | Huang |
| 5,371,321 A | 12/1994 | Hamzehdoost et al. |
| 5,399,902 A | 3/1995 | Bickford et al. |
| 5,406,117 A | 4/1995 | Dlugokecki |
| 5,436,203 A | 7/1995 | Lin |
| 5,557,142 A | 9/1996 | Gilmore et al. |

(List continued on next page.)

OTHER PUBLICATIONS

Caggiano "Electrical Characterization and Modeling of IC Packaging," *Electronic Packaging and Interconnection Handbook*, Harper, C. A. Ed., McGraw–Hill, pp. 14.1–14.53 (2000).

(List continued on next page.)

*Primary Examiner*—Sheila V. Clark
(74) *Attorney, Agent, or Firm*—Townsend and Townsend and Crew LLP

(57) ABSTRACT

A wirebonded semiconductor package structure that provides for high frequency operation, a large number of I/O terminals, controlled low impedance, compensated inductance, electromagnetic shielding against cross-talk and prevention of false signals from ground bounce includes a semiconductor device, a semiconductor package substrate and a wirebond(s) electrically connecting the semiconductor device to the semiconductor package substrate. The wirebonded semiconductor package structure also includes a first insulating encapsulant layer at least partially encapsulating the wirebond(s) and a conductor layer (e.g., a patterned gold conductor layer) disposed on the first insulating encapsulant layer and electrically connected to the semiconductor package substrate. A method for manufacturing such a wirebonded semiconductor package includes wirebonding a semiconductor device (i.e., a die) to a semiconductor package substrate to form a semiconductor package structure that includes the die, the semiconductor package substrate and a wirebond(s) electrically connecting the die to the semiconductor package substrate. A first insulating encapsulant layer is then applied that at least partially encapsulates the wirebond(s). A conductor layer (e.g., a gold conductor layer) is subsequently applied on the first insulating encapsulant layer such that the conductor layer is electrically connected to the semiconductor package substrate, thereby creating a wirebonded semiconductor package structure. Thereafter, the conductor layer is optionally patterned to form a patterned conductor layer that is electrically connected to the semiconductor package substrate.

15 Claims, 5 Drawing Sheets

U.S. PATENT DOCUMENTS

| | | | |
|---|---|---|---|
| 5,672,909 | A | 9/1997 | Glenn et al. |
| 5,838,072 | A | 11/1998 | Li |
| 6,008,534 | A | 12/1999 | Fulcher |
| 6,064,113 | A | 5/2000 | Kirkman |
| 6,092,281 | A | 7/2000 | Glenn |
| 6,093,957 | A | 7/2000 | Kwon |
| 6,177,726 | B1 * | 1/2001 | Manteghi |
| 6,184,587 | B1 * | 2/2001 | Khandros et al. |

OTHER PUBLICATIONS

Franzon, P. D., "Electrical Design of Digital Multichip Modules," *Multicip Module Technologies and Alternatives: The Basics*, Daryl Annn Doaqne and Paul D. Franzon Eds., Van Nostrand Reinhold NY, pp. 525–568 (1993).

Helszajn, *Microwave Engineering Passive, Active and Non Reciprocal Circuits* McGraw–Hill, pp. 65–85 (1992).

Humpston "The Essential Role Of Gold In The Fabrication Of Microwave Electronics Systems", Gold Bulletin 32:75–79 (1999).

Katyl et al."Electrical Design Concepts in Electronic Packaging", *Principles of Electronic Packaging*, Seraphim, D. P. Lasky, R. C. and Li, C. Y. Eds., McGraw–Hill, pp. 69–102 (1989).

Pease et al. "Physical Limits to the Useful Packaging Density of Electronic Systems", IBM J. Res. Develop. 32:636–646 (1988).

Solomon et al. "Design Optimization of BGA Packages," Semicon West 2000 Proceedings pp. A1–A6 (2000).

Sutherland "As edge speeds increase, wires become transmission lines", EDN Oct. 14, 1999, pp. 75–94.

Zheng, "Full Wave Electromagnetic Simulation of S–Parameter SPICE Simulation for High Speed Digital Interconnects", IMAPS Advanced Technology Workshop on Future Digital Interconnects over 1 000 MHz, Jan. 18, 2000.

\* cited by examiner

WIREBONDED SEMICONDUCTOR PACKAGE STRUCTURE AND METHOD OF MANUFACTURE

BACKGROUND OF THE INVENTION

1. Field of the Invention

The present invention relates, in general, to semiconductor packaging and, in particular, to structures and manufacturing methods for wirebonded semiconductor packages.

2. Description of the Related Art

Semiconductor package structures provide for semiconductor devices contained therein (e.g., an integrated circuit) to be electrically connected to an external system via input/output (I/O) terminals and protected from deleterious environmental factors. Wirebonding is a conventional method for making an electrical connection between a semiconductor device and a semiconductor package substrate.

In a conventional wirebonding method, a semiconductor device (also referred to as a "die") is adhered to a semiconductor package substrate using, for example, epoxy. Wirebonds, which are essentially short loops of metallic wire (e.g., aluminum wire or gold wire), are subsequently connected between the die and the semiconductor package substrate. Typically, the wirebonds and die are then covered with an encapsulant material (e.g., an epoxy molding compound).

FIGS. 1A and 1B are simplified cross-sectional and top view illustrations, respectively, depicting a conventional wirebonded semiconductor package structure 10. Wirebonded semiconductor package structure 10 includes a die 12 and a semiconductor package substrate 14. Wirebonded semiconductor package substrate 10 also includes a plurality of wirebonds 16 electrically connecting die 12 to semiconductor package substrate 14. In a conventional wirebonded semiconductor package structure, encapsulant material (not shown) covers wirebonds 16 and die 12.

State-of-the-art semiconductor devices are often designed to operate at high frequencies (e.g., at operating frequencies in the range of 10 MHz to greater than 10 GHz) and with a relatively large number of I/O terminals. At high operating frequencies, conventional wirebonded semiconductor package structures can exhibit undesirable electrical characteristics, such as high impedance, uncompensated conductance and false signals originating from ground bounce. Furthermore, as the number of I/O terminals increases, conventional wirebonded semiconductor package structures are susceptible to cross-talk (i.e., electrical noise coupled between wirebonds) due to inadequate electromagnetic shielding between neighboring wirebonds.

Several approaches have been taken to eliminate or reduce the aforementioned undesirable electrical characteristics. For example, coplanar waveguide structures, stripline structures, the use of conductors that encase a semiconductor package structure, and multiple grounded wirebonds have been employed to control impedance, improve electromagnetic shielding and create a compensating parallel inductance. In addition, flip chip and chip scale semiconductor packages have been employed for semiconductor devices that operate at high frequencies and/or require a large number of I/O terminals. Each of these approaches, however, is either costly, incompatible with a large number of I/O terminals and/or less understood and validated with respect to reliability than a conventional wirebonded semiconductor package structure.

Still needed in the field, therefore, are a wirebonded semiconductor package structure and a method for manufacturing the same that provides for high frequency operation and a relatively large number of I/O terminals. Such a wirebonded semiconductor package structure should provide for controlled low impedance, compensated inductance, electromagnetic shielding against cross-talk and prevention of false signals from ground bounce.

BRIEF SUMMARY OF THE INVENTION

The present invention provides a wirebonded semiconductor package structure that enables high frequency operation, a large number of I/O terminals, controlled low impedance, compensated inductance, electromagnetic shielding against cross-talk and prevention of false signals from ground bounce. Also provided by the present invention is an inexpensive method for manufacturing such a wirebonded semiconductor package structure.

A wirebonded semiconductor package structure according to one exemplary embodiment of the present invention includes a semiconductor device, a semiconductor package substrate and a wirebond(s) electrically connecting the semiconductor device to the semiconductor package substrate. The wirebonded semiconductor package structure also includes a first insulating encapsulant layer at least partially encapsulating the wirebond(s) and a conductor layer (e.g., a patterned gold conductor layer) disposed on the first insulating encapsulant layer and electrically connected to the semiconductor package substrate. The conductor layer can be electrically connected to, for example, a ground connection of the semiconductor package substrate.

Having an electrically connected conductor layer (or a patterned conductor layer) near the wirebond(s) provides several benefits in wirebonded semiconductor package structures according to the present invention. First, since bondwire impedance is reduced when a bondwire is close to an electrical reference plane (e.g., a conductor layer of patterned conductor layer electrically connected to ground), it reduces the impedance of the wirebond(s) of the wirebonded semiconductor package structure. Second, the inductance of the wirebond is also compensated, and therefore reduced, by the presence of the electrically connected conductor layer. The lowering of impedance and compensation of inductance enables the semiconductor device to operate at high frequencies (e.g., frequencies in the range of 10 MHz to 10 GHz) without significant signal attenuation. Third, the presence of the conductor layer provides electromagnetic shielding for the wirebond(s), thus reducing cross-talk and enabling the use of a large number of I/O terminals. Fourth, the conductor layer diminishes the possibility of ground bounce by effectively reducing the ground impedance of the wirebonded semiconductor package structure.

A method for manufacturing a wirebonded semiconductor package structure according to one exemplary embodiment of the present invention includes wirebonding a die to a semiconductor package substrate to form a semiconductor package structure. The semiconductor package structure thus formed includes the die, the semiconductor package substrate and a wirebond(s) electrically connecting the die to the semiconductor package substrate. Next, a first insulating encapsulant layer is applied to the semiconductor package structure at least partially encapsulating the wirebond(s). A conductor layer is subsequently applied on the first insulating encapsulant layer such that the conductor layer is electrically connected to the semiconductor package substrate, thereby creating a wirebonded semiconductor package structure. Thereafter, if desired to further improve the electrical characteristics of the wirebonded semiconductor package structure, the conductor layer can be patterned to form a patterned conductor layer that is electrically connected to the semiconductor package substrate. Methods according to the present invention utilize conventional processing techniques and are, therefore, inexpensive.

A better understanding of the features and advantages of the present invention will be obtained by reference to the following detailed description that sets forth illustrative embodiments, in which the principles of the invention are utilized, and the accompanying drawings.

DETAILED DESCRIPTION OF THE INVENTION

Figure 1A:
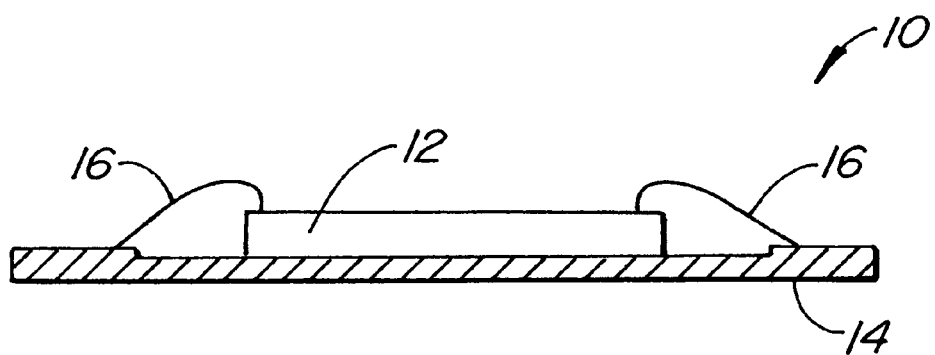
FIGS. 1A and 1B are simplified cross-sectional side and top views, respectively, of a conventional wirebonded semiconductor package substrate.
Figure 1B:
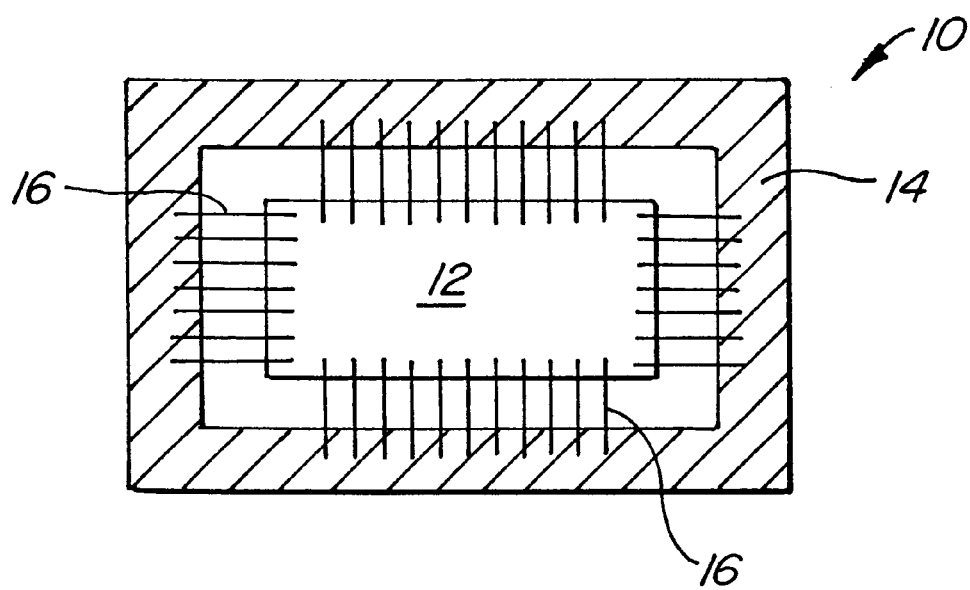
Figure 2:
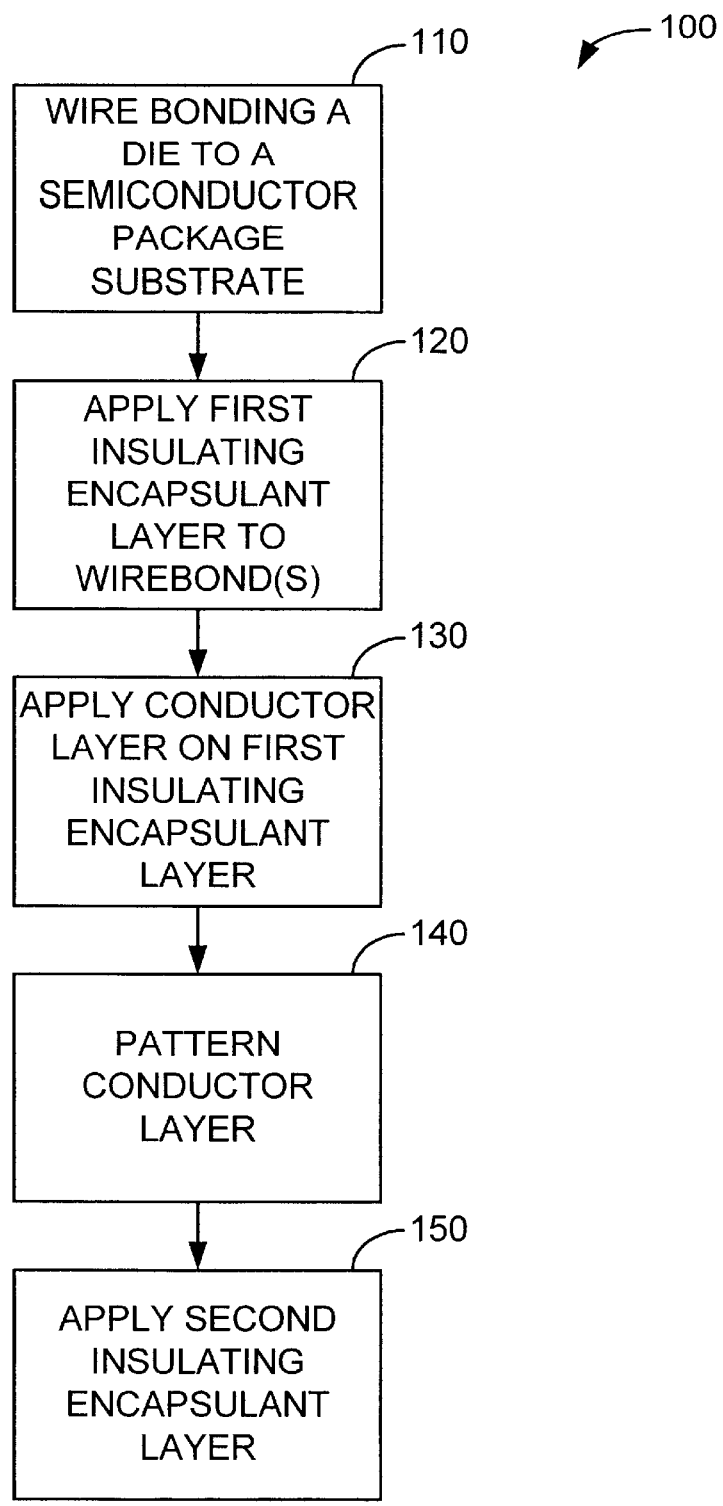
FIG. 2 is a flow diagram illustrating a sequence of steps in a process according to one exemplary embodiment of the present invention.

FIG. 2 is a flow diagram illustrating a sequence of steps in a process 100 for manufacturing a wirebonded semiconductor package structure in accordance with an exemplary embodiment of the present invention. Process 100 includes, at step 110, wirebonding a semiconductor device (i.e., a die) to a semiconductor package substrate to form a semiconductor package structure. Such a semiconductor package structure includes the aforementioned die and semiconductor package substrate and at least one wirebond electrically connecting the die to the semiconductor package substrate.

The die and semiconductor package substrate can be any suitable die and semiconductor package substrate known to one skilled in the art, including but not limited to, a die designed to operate at frequencies in the range of 10 MHz to greater than 10 GHz and a plastic ball grid array (PBGA) semiconductor package substrate and/or laminated semiconductor package substrate. The wirebonding of step 110 can be accomplished using conventional techniques known to one skilled in the art.

Figure 3:
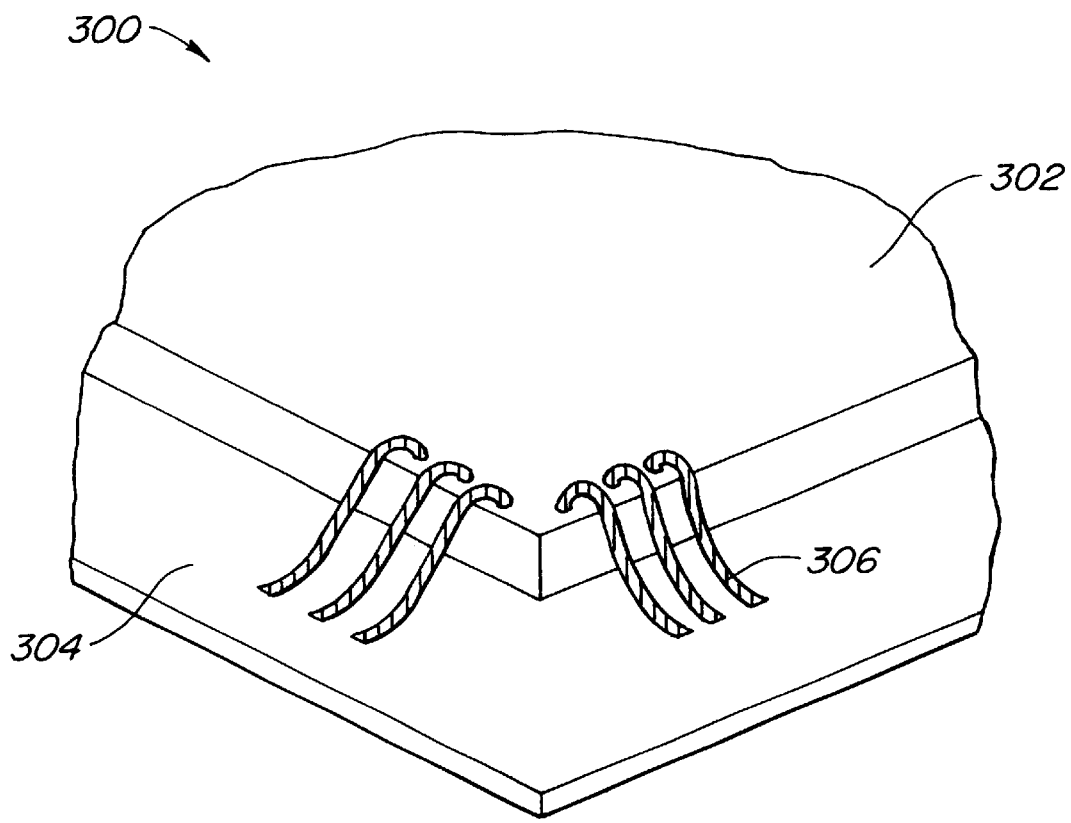
FIG. 3 is a simplified depiction of a portion of a semiconductor package structure formed by a wirebonding step of a process according to one exemplary embodiment of the present invention.

FIG. 3 is a simplified perspective representation of a portion of an exemplary semiconductor package structure 300 formed by wirebonding a die 302 to a semiconductor package substrate 304 in accordance with step 110 of FIG. 2. In the embodiment of FIG. 3, die 302 is electrically connected to semiconductor package substrate 304 via a plurality of wirebonds 306. The pitch associated with wirebonds 306 can be any suitable pitch including, for example, an ultra-fine pitch of less than 50 microns.

Referring again to FIG. 2, following wirebonding step 110, a first insulating encapsulant layer is applied to the semiconductor package structure in a manner such that the first insulating layer at least partially encapsulates the at least one wirebond, as set forth in step 120. The first insulating encapsulant layer can be applied using any suitable technique known to one skilled in the art including, but not limited to, an automated or manual dispensing technique, a spray technique or a spinning technique. A typical thickness for the first insulating layer (which may be variable along the length of a wirebond) is in the range of a 3 microns to 50 microns.

The first insulating encapsulant layer can be formed of any suitable encapsulant material. The encapsulant material and application technique employed must be selected, however, such that the application of the first insulating encapsulant layer does not result in wirebonds touching one another. In addition, it is desirable that the looping geometry of the wirebonds be preserved. For wirebonds with an ultra-fine pitch, it is also desirable that the encapsulating material be able to pass through the small spacing between the wirebonds during step 120. The suitability of an encapsulant material is, therefore, a function of the wirebond pitch. Suitable encapsulant materials include, but is not limited to, NoSweep® encapsulant (commercially available from Kulicke & Soffa Industries).

Many conventional encapsulant materials require a UV or thermal curing step following application. Typical curing conditions are a temperature between 100° C. and 140° C. for a time period in the range of 5 seconds to 20 seconds.

Next, a conductor layer is applied on the first insulating encapsulant layer in a manner that provides an electrical connection between the conductor layer and the semiconductor package substrate, as set forth in step 130. This electrical connection can, for example, be configured to function as a ground connection when the semiconductor device is in operation. Alternatively, the electrical connection can be a connection to a power source, an electrical signal source or a floating electrical connection of the semiconductor package substrate. The application of the conductor layer creates a wirebonded semiconductor package structure.

The conductor layer can be applied to the first insulating encapsulant layer using, for example, a sputtering technique, an evaporation technique or other technique known to one skilled in the art. The conductor layer can be formed of any suitable electrically conductive material, such as gold, silver, palladium and copper. A typical thickness of the conductor layer is in the range of 0.5 $\mu$m to 5 $\mu$m.

Next, the conductor layer is optionally patterned to form a patterned conductor layer, as set forth in step 140. The patterned conductor layer thus formed remains electrically connected to the semiconductor package substrate (e.g., to a ground connection of the semiconductor package substrate or bus bar of the semiconductor package substrate). If desired, the first insulating encapsulant layer can also be patterned during step 140. The conductor layer can be patterned using conventional laser techniques, such as, an excimer laser technique. The patterning of the conductor layer is essentially a laser trimming operation.

The pattern formed in step 140 is selected to provide the at least one wirebond with a predetermined impedance. In one exemplary embodiment, the pattern of the conductor layer is such that a strip of the patterned conductor layer (e.g., with a width in the range of 1–5 times the width of a wirebond) runs essentially parallel to (i.e., follows or is aligned with) the at least one wirebond. In other words, the strip conforms to the profile of the wirebond and its overlying first encapsulant layer.

The impedance of wirebonds in wirebonded semiconductor package structures according to the present invention is a function of the diameter of the wirebonds, the pitch of the wirebonds, the thickness of the first insulating encapsulant layer, the pattern of the patterned conductor layer (in the circumstance where the conductor layer is patterned) and the nature of the electrical connection between the conductor layer (or patterned conductor layer) and the semiconductor package substrate (e.g., a ground connection or a power connection).

Impedance is determined by the ratio of inductance to capacitance. A wirebond, when located a defined distance away from a reference plane (e.g., a conductor layer or patterned conductor layer connected to ground or a power connection) has a well-defined inductance. In addition, the combination of wirebond, first insulating encapsulant layer and conductor layer (or patterned conductor layer) will have a well-defined capacitance. Therefore, the impedance, conductance and capacitance can be controlled through the proper selection of the diameter of the wirebonds, the pitch of the wirebonds, the thickness of the first insulating encapsulant layer and the nature of the electrical connection between the conductor layer (or patterned conductor layer) and the semiconductor package substrate. In addition, in the circumstance that the conductor layer was patterned to form a patterned conductor layer, the impedance, conductance and capacitance can also be controlled through the proper selection of the pattern of the patterned conductor layer.

Figure 4A:
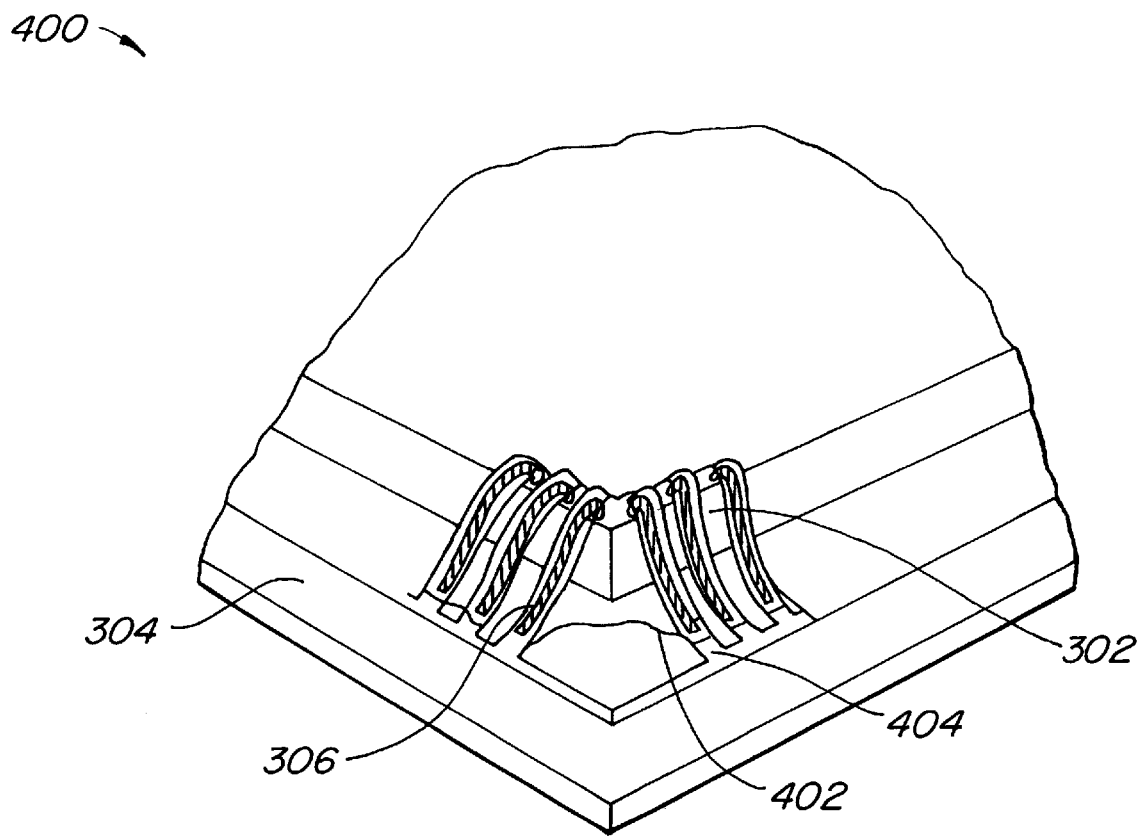
FIGS. 4A and 4B are simplified perspective and cross-section side view depictions, respectively, of a portion of a wirebonded semiconductor package structure formed by a patterning step of a process according to one exemplary embodiment of the present invention.
Figure 4B:
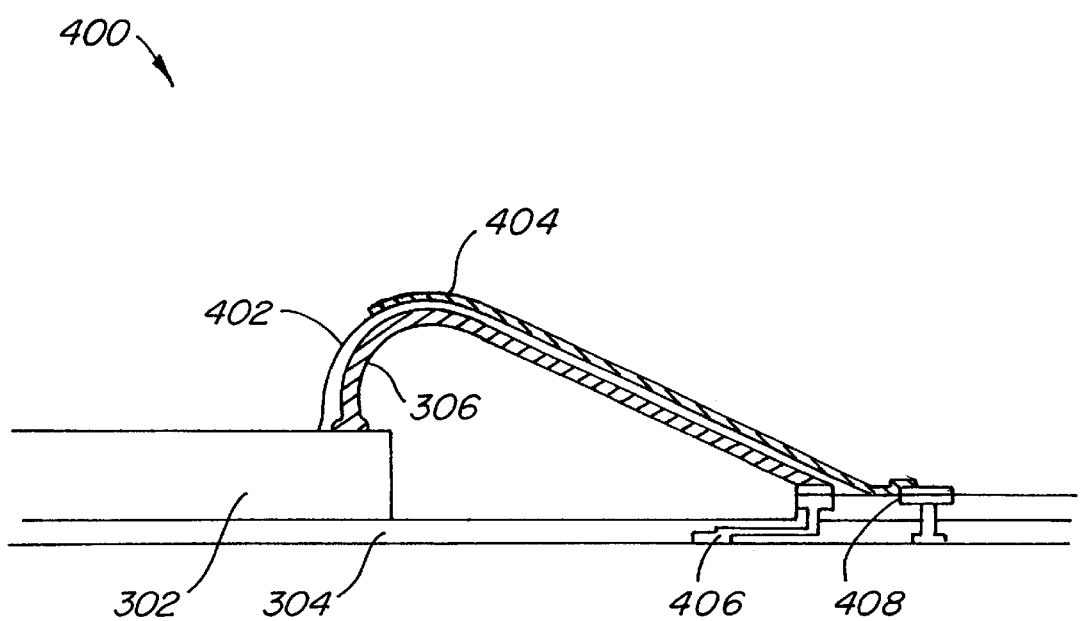

FIGS. 4A and 4B are simplified perspective and cross-section side view representations, respectively, of a portion of one exemplary embodiment of wirebonded semiconductor package structure 400 formed by patterning a conductor layer, as set forth in step 140 of FIG. 2. In the embodiment of FIG. 4, die 302 is electrically connected to semiconductor package substrate 304 via a plurality of wirebonds 306. Wirebonds 306 are encapsulated by first insulating encapsulant layer 402 (shown as a transparent layer for simplicity), while patterned conductor layer 404 (also shown as a transparent layer for simplicity) is disposed on first insulating encapsulant layer 402. Patterned conductor layer 404 has the form of a series of strips that are aligned with each of wirebonds 306.

If desired, a second insulating encapsulant layer (e.g., an epoxy molding compound layer) can then be applied to the wirebonded semiconductor package structure covering the patterned conductor layer, first insulating encapsulant layer and semiconductor device. The presence of such a second insulating encapsulant layer serves to protect the patterned conductor layer and preserve the benefits provided by the patterned conductor layer.

The second insulating encapsulant layer can be of any encapsulating material known to one skilled in the art and can be applied using conventional techniques. The maximum thickness of the second encapsulating layer can be, for example, 35 mils.

FIG. 4 also serves to depict a portion of a wirebonded semiconductor package structure 400 according to one exemplary embodiment of the present invention. Wirebonded semiconductor package structure 400 includes a die 302, a semiconductor package substrate 304 and a plurality of wirebonds 306. Wirebonds 306 serve to electrically connect die 302 to semiconductor package substrate 304.

Wirebonded semiconductor package structure 400 also includes a first insulating encapsulant layer 402 at least partially encapsulating each of the wirebonds 306 and a patterned conductor layer 404 disposed on the first insulating encapsulant layer 402 and electrically connected to the semiconductor package substrate. As explained above, wirebonded semiconductor packages according to the present invention can include a conductor layer disposed on the first insulating encapsulant layer instead of a patterned conductor layer. In the embodiment of FIG. 4B, semiconductor package substrate 304 includes electrical connection terminals 406 and 408 electrically connected to wirebond 306 and patterned conductor layer 404, respectively.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for manufacturing a wirebonded semiconductor package structure, the method comprising:
    wirebonding a die to a semiconductor package substrate to form a semiconductor package structure that includes:
        the die;
        the semiconductor package substrate; and
        at least one wirebond electrically connecting the die to the semiconductor package substrate;
    applying a first insulating encapsulant layer with a thickness in the range of 3 microns to 50 microns to the semiconductor package structure at least partially encapsulating the wirebond; and
    applying a conductor layer on the first insulating encapsulant layer, the conductor layer electrically connected to the semiconductor package substrate, thereby creating a wirebonded semiconductor package structure.

2. The method of claim 1 further comprising:
    patterning the conductor layer to form a patterned conductor layer that is electrically connected to the semiconductor package substrate.

3. The method of claim 2 further comprising, during the patterning step, patterning a conductor layer to form a patterned conductor layer disposed within a range of 3 microns to 50 microns from the wirebond, whereby the impedance of the wirebond of the wirebonded semiconductor package structure is controlled.

4. The method of claim 2 further comprising, after the patterning step, applying a second insulating encapsulant layer over the patterned conductor layer.

5. The method of claim 2 further comprising, during the patterning step, patterning a conductor layer to form a patterned conductor layer with at least one strip that conforms to the wirebond.

6. A method for manufacturing a wirebonded semiconductor package structure, the method comprising:
    wirebonding a die to a semiconductor package substrate to form a semiconductor package structure that includes:
        the die;
        the semiconductor package substrate; and
        at least one wirebond electrically connecting the die to the semiconductor package substrate;
    applying a first insulating encapsulant layer to the semiconductor package structure at least partially encapsulating the wirebond;
    applying a conductor layer on the first insulating encapsulant layer, the conductor layer electrically connected to the semiconductor package substrate, thereby creating a wirebonded semiconductor package structure; and
    patterning the conductor layer with a laser to form a patterned conductor layer that is electrically connected to the semiconductor package substrate.

7. A method for manufacturing a wirebonded semiconductor package structure, the method comprising:
wirebonding a die to a semiconductor package substrate to form a semiconductor package structure that includes:
the die;
the semiconductor package substrate; and
at least one wirebond electrically connecting the die to the semiconductor package substrate;
applying a first insulating encapsulant layer to the semiconductor package structure at least partially encapsulating the wirebond; and
applying a conductor layer on the first insulating encapsulant layer, the conductor layer electrically connected to the semiconductor package substrate, thereby creating a wirebonded semiconductor package structure, wherein the conductor layer is electrically connected to a ground connection of the semiconductor package substrate.

8. A method for manufacturing a wirebonded semiconductor package structure, the method comprising:
wirebonding a die to a semiconductor package substrate to form a semiconductor package structure that includes:
the die;
the semiconductor package substrate; and
at least one wirebond electrically connecting the die to the semiconductor package substrate;
applying a first insulating encapsulant layer to the semiconductor package structure at least partially encapsulating the wirebond; and
applying a conductor layer on the first insulating encapsulant layer, the conductor layer electrically connected to the semiconductor package substrate, thereby creating a wirebonded semiconductor package structure, wherein the conductor layer is electrically connected to a power source connection of the semiconductor package substrate.

9. A method for manufacturing a wirebonded semiconductor package structure, the method comprising:
wirebonding a die to a semiconductor package substrate to form a semiconductor package structure that includes:
the die;
the semiconductor package substrate; and
at least one wirebond electrically connecting the die to the semiconductor package substrate;
applying a first insulating encapsulant layer to the semiconductor package structure at least partially encapsulating the wirebond; and
applying a conductor layer on the first insulating encapsulant layer, the conductor layer electrically connected to the semiconductor package substrate, thereby creating a wirebonded semiconductor package structure, wherein the conductor layer is electrically connected to an electrical signal connection of the semiconductor package substrate.

10. A wirebonded semiconductor package structure comprising:
a semiconductor device;
a semiconductor package substrate;
at least one wirebond electrically connecting the semiconductor device to the semiconductor package substrate;
a first insulating encapsulant layer at least partially encapsulating the wirebond, the first encapsulating layer having thickness in the range of 3 microns to 50 microns; and
a conductor layer disposed on the first insulating encapsulant layer and electrically connected to the semiconductor package substrate.

11. The wirebonded semiconductor package substrate of claim 10, wherein the conductor layer is a patterned conductor layer.

12. A wirebonded semiconductor package structure comprising:
a semiconductor device;
a semiconductor package substrate;
at least one wirebond electrically connecting the semiconductor device to the semiconductor package substrate;
a first insulating encapsulant layer at least partially encapsulating the wirebond;
a conductor layer disposed on the first insulating encapsulant layer and electrically connected to the semiconductor package substrate; and
a second insulating encapsulant layer disposed on the patterned conductor layer.

13. The wirebonded semiconductor package structure of claim 10 wherein the patterned conductor layer disposed within a range of 3 microns to 50 microns of the wirebond.

14. The wirebonded semiconductor package structure of claim 11, wherein the patterned conductor layer includes at least one strip that conforms to the wirebond.

15. A wirebonded semiconductor package structure comprising:
a semiconductor device;
a semiconductor package substrate;
at least one electrically connecting the semiconductor device to the semiconductor package substrate;
a first insulating encapsulant layer at least partially encapsulating the wirebond;
a conductor layer disposed on the first insulating encapsulant layer and electrically connected to the semiconductor package substrate, wherein the conductor layer is electrically connected to a ground connection of the semiconductor package substrate.

* * * * *